United States Patent
Koyama et al.

(10) Patent No.: US 8,068,326 B2
(45) Date of Patent: Nov. 29, 2011

(54) ELECTROSTATIC CHUCK AND SUBSTRATE TEMPERATURE CONTROL FIXING APPARATUS

(75) Inventors: Tomoaki Koyama, Nagano (JP); Koki Tamagawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 161 days.

(21) Appl. No.: 12/482,901

(22) Filed: Jun. 11, 2009

(65) Prior Publication Data

US 2009/0310274 A1 Dec. 17, 2009

(30) Foreign Application Priority Data

Jun. 13, 2008 (JP) .................. 2008-156019

(51) Int. Cl.
*H02G 7/02* (2006.01)
(52) U.S. Cl. .............. 361/234; 361/233; 361/231
(58) Field of Classification Search ............ 361/234, 361/233, 231

See application file for complete search history.

(56) References Cited

U.S. PATENT DOCUMENTS

| | | | | |
|---|---|---|---|---|
| 6,373,679 | B1 * | 4/2002 | Qiao et al. | 361/230 |
| 7,352,555 | B2 * | 4/2008 | Handa et al. | 361/234 |
| 7,623,334 | B2 * | 11/2009 | Mizuno et al. | 361/234 |
| 7,848,077 | B2 * | 12/2010 | Mizuno et al. | 361/234 |
| 2003/0030960 | A1 * | 2/2003 | Kanno et al. | 361/234 |
| 2003/0102087 | A1 * | 6/2003 | Ito et al. | 156/345.46 |
| 2008/0174930 | A1 * | 7/2008 | Hattori et al. | 361/234 |

FOREIGN PATENT DOCUMENTS

| | | |
|---|---|---|
| JP | 2000-317761 | 11/2000 |
| JP | 2000-332091 | 11/2000 |

* cited by examiner

*Primary Examiner* — Patrick Salce
(74) *Attorney, Agent, or Firm* — Rankin, Hill & Clark LLP (57) ABSTRACT

There is provided an apparatus including: an electrostatic chuck for holding an object; and a base plate which supports the electrostatic chuck and controls a temperature of the electrostatic chuck. The electrostatic chuck is fixed onto the base plate via an adhesive layer. The electrostatic chuck includes: a base; an electrostatic electrode built in the base; and a mounting portion containing a dielectric material and detachably mounted on the base. The object is mounted on the mounting portion.

15 Claims, 10 Drawing Sheets

ELECTROSTATIC CHUCK AND SUBSTRATE TEMPERATURE CONTROL FIXING APPARATUS

This application claims priority from Japanese Patent Application No. 2008-156019, filed on Jun. 13, 2008, the entire contents of which are hereby incorporated by reference.

BACKGROUND OF THE INVENTION

1. Technical Field

The present disclosure relates to an electrostatic chuck and a substrate temperature control fixing apparatus including the electrostatic chuck. More particularly, the present disclosure relates to an electrostatic chuck for holding an object mounted on a base and a substrate temperature control fixing apparatus including the electrostatic chuck.

2. Related Art

The film forming apparatus (e.g., the CVD apparatus, the PVD apparatus) and the plasma etching machine used in manufacturing a semiconductor device such as IC or LSI is equipped with a stage to hold a substrate (e.g., silicon wafer) in a vacuum processing chamber with good precision. As such stage, a substrate temperature control fixing apparatus equipped with an electrostatic chuck, for example, has been proposed. The substrate temperature control fixing apparatus attracts and holds the substrate with the electrostatic chuck, and performs a temperature control such that the substrate is maintained at a predetermined temperature.

Figure 1:
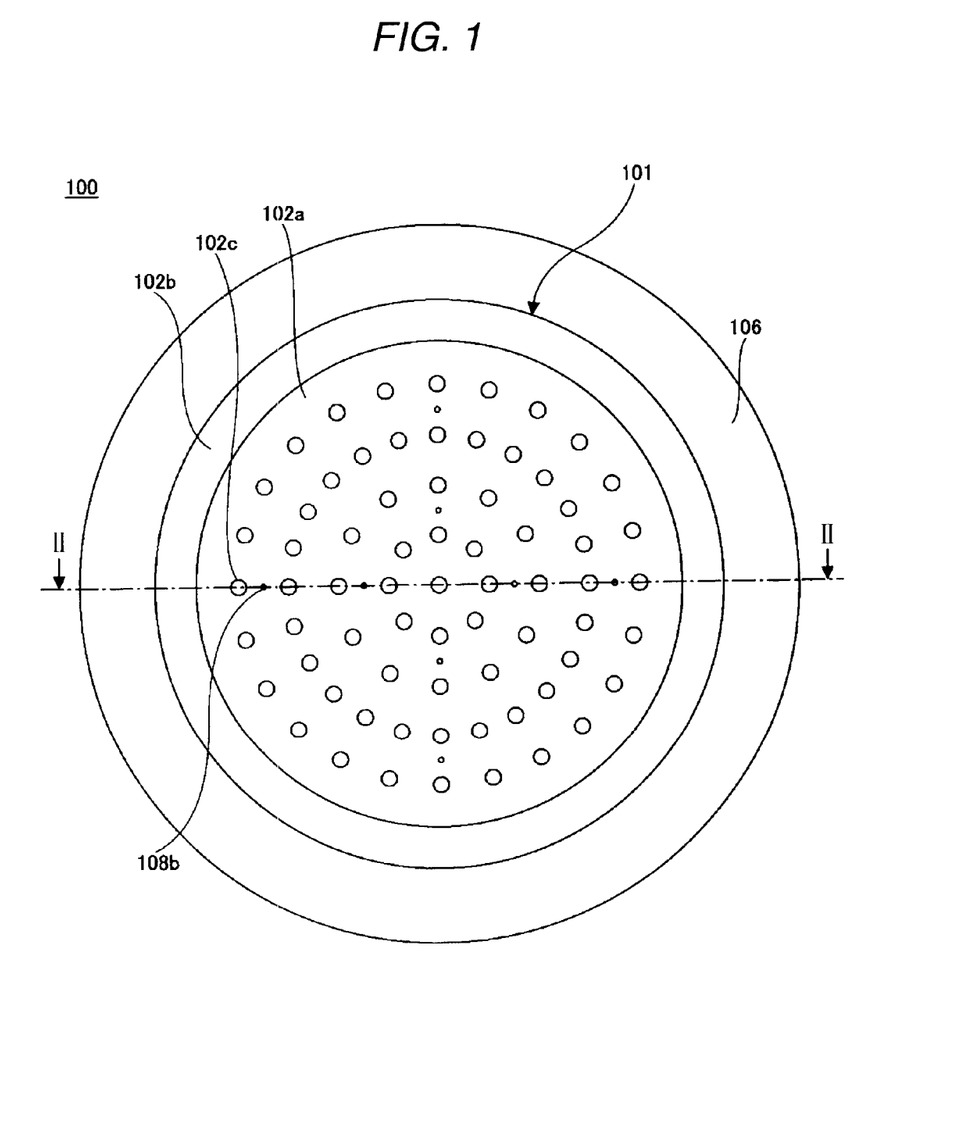
FIG. 1 is a schematic plan view showing a substrate temperature control fixing apparatus in the related art.
Figure 2:
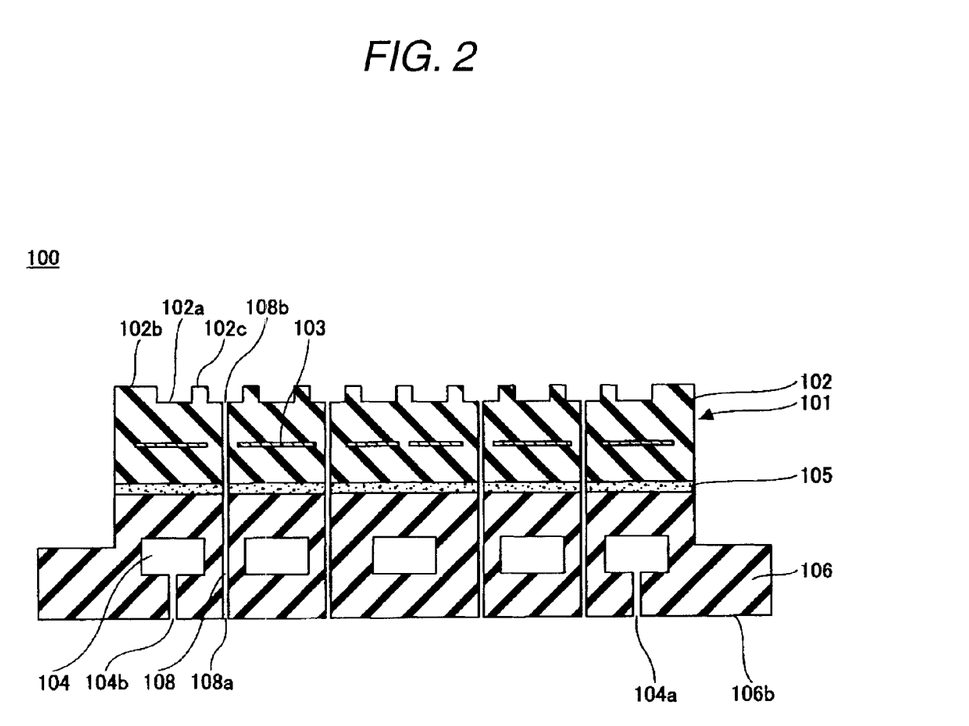
FIG. 2 is a schematic sectional view showing the substrate temperature control fixing apparatus in the related art and taken along a II-II line in FIG. 1.

FIG. 1 is a schematic plan view showing a substrate temperature control fixing apparatus in the related art. FIG. 2 is a schematic sectional view showing the substrate temperature control fixing apparatus in the related art, and taken along a II-II line in FIG. 1. By reference to FIG. 1 and FIG. 2, a substrate temperature control fixing apparatus 100 has an electrostatic chuck 101, an adhesive layer 105, and a base plate 106.

The electrostatic chuck 101 is the Coulomb force type electrostatic chuck or the Johnson-Rahbek type electrostatic chuck having a base 102 and electrostatic electrodes 103. The base 102 is fixed on the base plate 106 via the adhesive layer 105. The base 102 is formed of ceramic. The base plate 106 is formed of Al. The adhesive layer 105 secures the base 102 and the base plate 106. As the adhesive layer 105, the silicon adhesive is used.

An outer peripheral sealing ring 102b as an annular projection portion, when viewed from the top, is provided on an outer edge portion of an upper surface 102a of the base 102. A large number of projection portions 102c shaped into a cylindrical column respectively are provided on the inner side of the outer peripheral sealing ring 102b such that they are dotted like a polka dots pattern, when viewed from the top.

The electrostatic electrodes 103 are formed of a thin film electrostatic electrode respectively, and are built in the base 102. The electrostatic electrodes 103 are connected to a DC power supply (not shown) provided outside of the substrate temperature control fixing apparatus 100. When a predetermined voltage is applied, the electrostatic electrodes 103 attracts and holds an object (not shown) such as a substrate on upper surfaces of the outer peripheral sealing ring 102b and the large number of projection portions 102c. A chucking force becomes stronger as the voltage applied to the electrostatic electrodes 103 is increased higher.

The base plate 106 is provided to support the electrostatic chuck 101. A heating element (not shown) and a water channel 104 are provided to the base plate 106 to perform the temperature control of the base 102. The heating elements (not shown) generate a heat when the voltage is applied thereto, and heats the base 102 via the adhesive layer 105.

The water channel 104 has a cooling water inlet 104a and a cooling water outlet 104b, each of which is formed in a lower surface 106b of the base plate 106. The cooling water inlet 104a and the cooling water outlet 104b are connected to a cooling water controlling unit (not shown) provided on the outside of the substrate temperature control fixing apparatus 100. The cooling water controlling unit (not shown) introduces the cooling water into the water channel 104 via the cooling water inlet 104a, and exhausts the cooling water from the cooling water outlet 104b. The cooling water is circulated to cool the base plate 106 and thus cool the base 102 via the adhesive layer 105.

A gas channel 108 is formed in the base 102, the adhesive layer 105, and the base plate 106 to pass therethrough. The gas channel 108 has a plurality of gas inlets 108a formed in the lower surface 106b of the base plate 106, and a plurality of gas outlets 108b formed in the upper surface 102a of the base 102. A plurality of gas inlets 108a are connected to a gas pressure controlling unit (not shown) provided out of the substrate temperature control fixing apparatus 100. The gas pressure controlling unit (not shown) can vary a pressure of an inert gas in a range of 0 to 50 Torr, for example, and can introduce an inert gas into the gas channel 108 from the gas inlets 108a.

Figure 3:
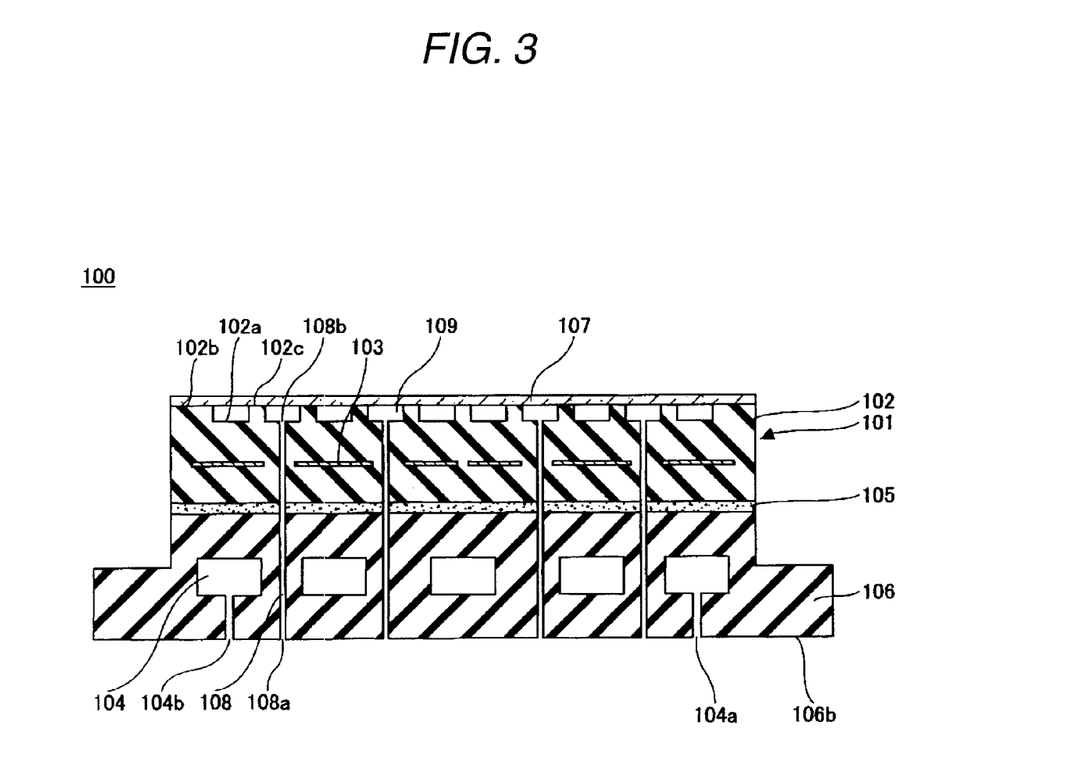
FIG. 3 is a schematic plan view showing a state that the related-art substrate temperature control fixing apparatus attracts and holds a substrate.

FIG. 3 is a schematic plan view showing a state that the related-art substrate temperature control fixing apparatus attracts and holds the substrate. In FIG. 3, the same reference symbols are affixed to the same components as those in FIG. 1 and FIG. 2, and their explanation will be omitted in some cases. In FIG. 3, 107 denotes a substrate, and 109 denotes a gas filling portion in which an inert gas is filled. By reference to FIG. 3, the substrate 107 is attracted and held on the upper surfaces of the outer peripheral sealing ring 102b and a large number of projection portions 102c of the base 102. A temperature of the substrate 107 is controlled by the heating element (not shown) and the water channel 104, which are built in the base plate 106.

The gas pressure controlling unit (not shown) introduces an inert gas into the gas channel 108 through a plurality of gas inlets 108a. The introduced inert gas is exhausted from the gas outlets 108b. When the inert gas is filled in the gas filling portions 109 formed between the substrate 107 and the upper surface 102a of the base 102, a thermal conductivity between the base 102 and the substrate 107 is improved. The outer peripheral sealing ring 102b is provided to prevent such an event that the inert gas filled in the gas filling portions 109 leaks to the outside of the gas filling portions 109.

As described above, the related-art substrate temperature control fixing apparatus 100 attracts and holds the substrate 107 on the upper surfaces of the outer peripheral sealing ring 102b and the large number of projection portions 102c of the base 102 of the electrostatic chuck 101. Also, the outer peripheral sealing ring 102b, which is formed as the annular projection portion, when viewed from the top, is provided on the outer edge portion of the upper surface 102a of the base 102 in the related-art substrate temperature control fixing apparatus 100. Thus, the outer peripheral sealing ring 102b prevents such an event that the inert gas, which is filled in the gas filling portions 109 to improve a thermal conductivity between the base 102 and the substrate 107, leaks to the outside of the gas filling portions 109. Also, the heating element (not shown) and the water channel 104, which are built in the base plate 106 in the related-art substrate temperature control fixing apparatus 100, control a temperature of the base plate 107 (see JP-A-2000-317761 and JP-A-2000-332091, for example).

However, the silicon adhesive constituting the adhesive layer 105 has a low plasma resistance. Therefore, when the related-art substrate temperature control fixing apparatus 100 is used in the plasma, the adhesive layer is exposed into the plasma and is corroded. When the adhesive layer 105 is eroded, the inert gas leaks through the eroded portion, and thus a thermal conductivity between the base 102 and the substrate 107 is degraded. Also, the plasma cleaning is applied to remove attached substances deposited on the upper surface 102a of the base 102. In this case, the plasma used in the cleaning not only removes the attached substances but also corrodes the upper surface 102a of the base 102.

When the adhesive layer 105 and the upper surface 102a of the base 102 are eroded by the plasma, degradation of the substrate temperature control fixing apparatus 100 is caused. At that time, the maintenance should be done by applying a renewal polishing or a cleaning using chemicals, or the like to the upper surface 102a of the base 102 or by replacing the over-all substrate temperature control fixing apparatus 100 with the new one. In this case, such a problem existed that a predetermined cost is needed in doing the maintenance and also an availability factor of the apparatus is lowered.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide an electrostatic chuck that is excellent in maintainability, and a apparatus including the electrostatic chuck.

According to one or more aspects of the present invention, there is provided an electrostatic chuck for holding an object. The electrostatic chuck comprises: a base; an electrostatic electrode built in the base; and a mounting portion containing a dielectric material and detachably mounted on the base. The object is mounted on the mounting portion.

According to one or more aspects of the present invention, there is provided an apparatus including: the above electrostatic chuck; and a base plate which supports the electrostatic chuck and controls a temperature of the electrostatic chuck. The electrostatic chuck is fixed onto the base plate via an adhesive layer.

Other aspects and advantages of the present invention will be apparent from the following description, the drawings, and the claims.

DETAILED DESCRIPTION OF EXEMPLARY EMBODIMENTS OF THE INVENTION

Exemplary embodiments of the present invention will be now described with reference to the drawings.

First Exemplary Embodiment

Figure 4:
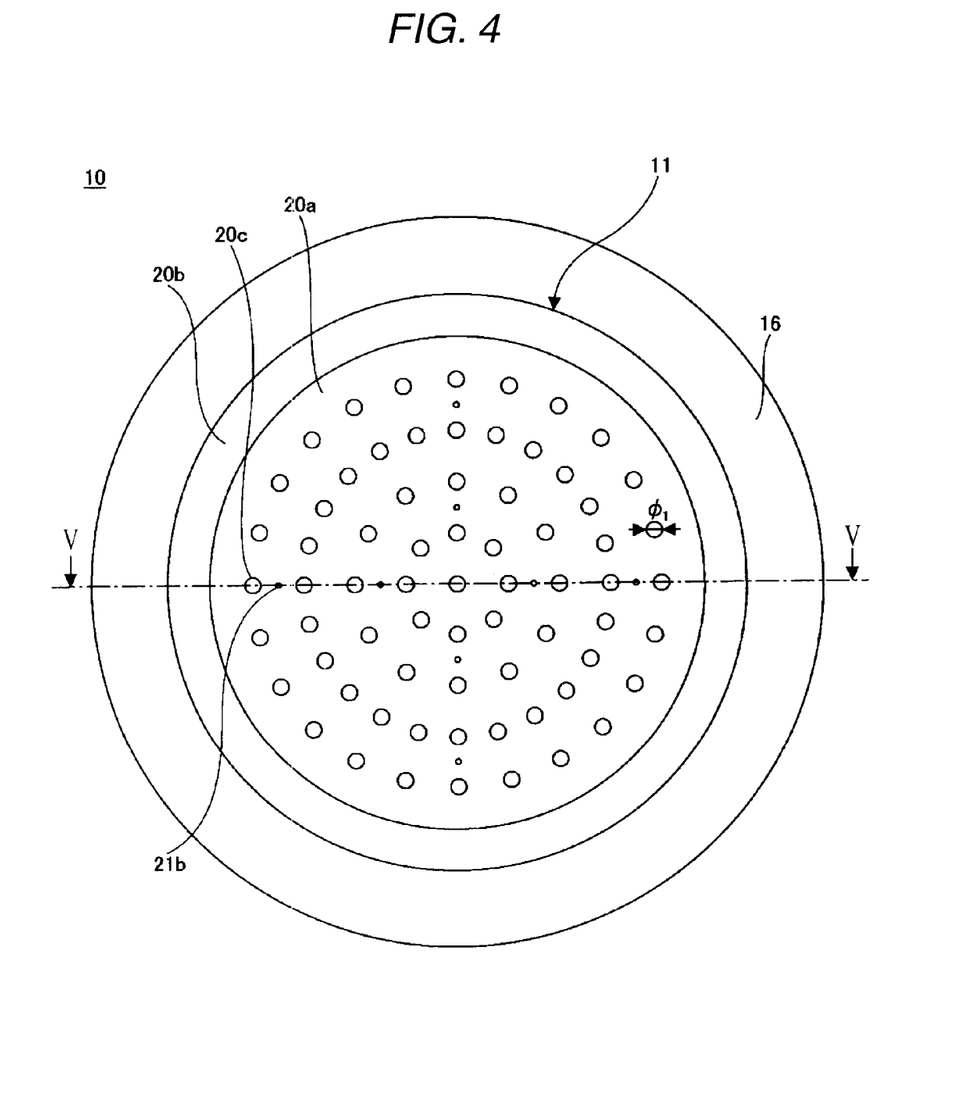
FIG. 4 is a schematic plan view showing a substrate temperature control fixing apparatus according to a first exemplary embodiment of the present invention.
Figure 5:
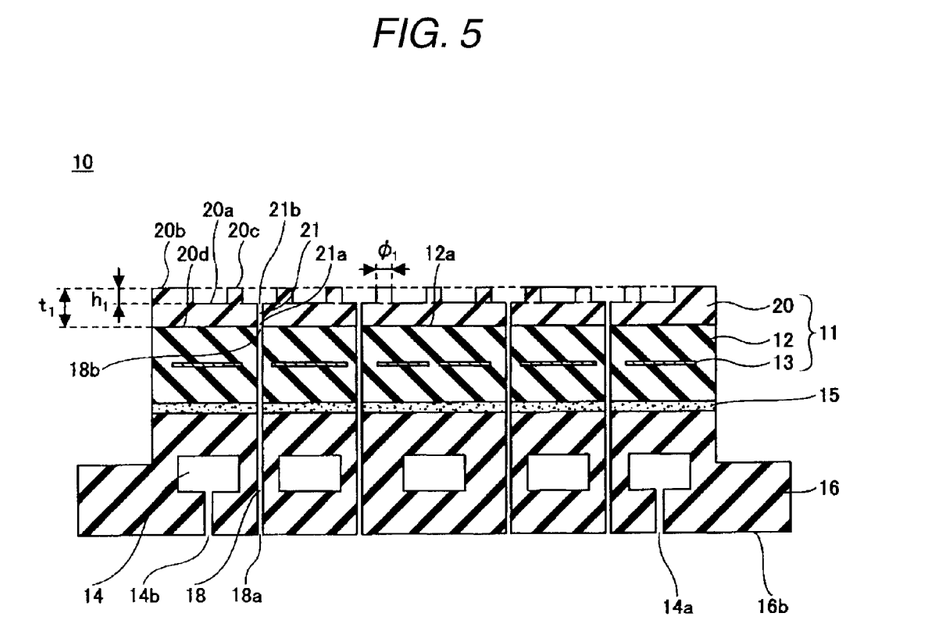
FIG. 5 is a schematic sectional view showing the substrate temperature control fixing apparatus according to the first exemplary embodiment of the present invention, and taken along a V-V line in FIG. 4.

FIG. 4 is a schematic plan view showing a substrate temperature control fixing apparatus according to a first exemplary embodiment of the present invention. FIG. 5 is a schematic sectional view showing the substrate temperature control fixing apparatus according to the first exemplary embodiment, and taken along a V-V line in FIG. 4. By reference to FIG. 4 and FIG. 5, a substrate temperature control fixing apparatus 10 is equipped with an electrostatic chuck 11, an adhesive layer 15, and a base plate 16.

The electrostatic chuck 11 is the Coulomb force type electrostatic chuck or the Johnson-Rahbek type electrostatic chuck having a base 12, electrostatic electrodes 13, and a mounting portion 20. The base 12 is formed of a dielectric material and is fixed on the base plate 16 via the adhesive layer 15. As the base 12, ceramics containing aluminum oxide ($Al_2O_3$), aluminum nitride (AlN), for example, may be employed. A thickness of the base 12 can be set to about 1.0 to 3.0 mm, for example, a relative dielectric constant (1 KHz) of the base 12 can be set to about 9 to 10, for example, and a volume resistivity of the base 12 can be set to about $10^{11}$ to $10^{13}$ $\Omega$cm, for example.

The mounting portion 20 is detachably mounted on an upper surface 12a of the base 12. The wording "detachably" means the following state. That is, when a voltage is applied to the electrostatic electrodes 13 and thus the mounting portion 20 is attracted and held onto the upper surface 12a of the base 12 by the Coulomb force, the mounting portion 20 cannot be detached. Meanwhile, when the voltage is not applied to the electrostatic electrodes 13, the mounting portion 20 can be easily detached or attached. Thus, the mounting portion 20 can be easily replaced with a new one when the mounting portion 20 is degraded, so that the electrostatic chuck that is excellent in maintainability can be implemented.

The mounting portion 20 is formed of a dielectric material, and a relative dielectric constant (1 KHz) can be set to about 9 to 10, for example, and a volume resistivity can be set to about $10^{11}$ to $10^{13}$ Ωcm, for example. Also, a thickness $t_1$ of the mounting portion 20 can be set to about 0.2 to 1.0 mm, for example. As the mounting portion 20, ceramics containing aluminum oxide ($Al_2O_3$), aluminum nitride (AlN), for example, can be employed. Also, titanium dioxide ($TiO_2$) may be added to aluminum oxide ($Al_2O_3$). Also, a dielectric film formed of polyester, polyimide, for example, may be used as the mounting portion 20.

In the mounting portion 20, 20a denotes an upper surface, and 20b denotes an outer edge portion of the upper surface 20a. The mounting portion 20 has a large number of projection portions 20c that are provided on the upper surface 20a to oppose to the object to be attracted (not shown). The projection portions 20c are formed in an area of the upper surface 20a of the mounting portion 20 except the outer edge portion 20b. The upper surface of the outer edge portion 20b is almost flush with the upper surfaces of the projection portions 20c.

Each of the projection portions 20c is shaped into a circular column, for example. A large number of projection portions 20c are provided in the area of the upper surface 20a of the mounting portion 20 except the outer edge portion 20b, and they are dotted like a polka dots pattern, when viewed from the top. In this manner, since the large number of projection portions 20c are provided on the upper surface 20a of the mounting portion 20, an amount of particles adhered onto the back surface of the object can be reduced.

Respective heights $h_1$ of the upper surfaces of the projection portions 20c are set substantially equal, and the height $h_1$ can be set to about 3 to 5 μm, for example. A diameter $\phi_1$ of the upper surface of the projection portion 20c can be set to about 0.1 to 2.0 mm, for example. In addition to the circular column shape (a circular shape when viewed from the top), the projection portions 20c may have elliptic shapes, polygonal shapes such as hexagonal shapes, combined shapes of a plurality of circular columns whose diameters are set differently or their combined shapes, when viewed from the top. Also, in the present specification, the projection portions 20c are recited as "like a polka dots pattern when viewed from the top", which includes all shapes in addition to the circular column shape (a circular shape when viewed from the top).

The projection portions 20c are formed by the sandblast process, for example. Concretely, fine particles are blasted onto the upper surface 20a of the mounting portion 20 with a gas pressure so as to etch non-masked portions, while masking the portions of the upper surface 20a where the projection portions 20c are to be formed on the mounting portion 20. In this case, the projection portions 20c may be arranged in compliance with any pattern regularity if they are provided substantially uniformly on the upper surface 20a of the mounting portion 20.

The respective electrostatic electrodes 13 are formed of a thin film electrode, and are built in the base 12. The electrostatic electrodes 13 are connected to a DC power supply (not shown) provided outside of the substrate temperature control fixing apparatus 10. When a predetermined voltage is applied, each of the electrostatic electrodes 13 applies a Coulomb force to the object (not shown) such as a substrate, and thus attracts and holds the object (not shown). A chucking force becomes stronger as the voltage applied to the electrostatic electrodes 13 is increased higher. As the electrostatic electrode 13, either the unipolar electrode or the bipolar electrode may be employed. As the material of the electrostatic electrodes 13, tungsten, molybdenum, for example, may be employed.

The adhesive layer 15 is provided to secure the base 12 on the base plate 16. As the adhesive layer 15, for example, the silicon adhesive can be employed which is excellent in flexibility and has a good thermal conductivity.

The base plate 16 is provided to support the electrostatic chuck 11. A heating element (not shown) and a water channel 14 are provided to the base plate 16 to perform the temperature control of the base 12 and the mounting portion 20. As the material of the base plate 16, Al, for example, may be employed. The heating elements (not shown) generate a heat when the voltage is applied thereto, and heat the base 12 and the mounting portion 20 via the adhesive layer 15.

The water channel 14 has a cooling water inlet 14a and a cooling water outlet 14b which are formed in a lower surface 16b of the base plate 16. The cooling water inlet 14a and the cooling water outlet 14b are connected to a cooling water controlling unit (not shown) provided on the outside of the substrate temperature control fixing apparatus 10. The cooling water controlling unit (not shown) introduces the cooling water into the water channel 14 via the cooling water inlet 14a, and exhausts the cooling water from the cooling water outlet 14b. The cooling water is circulated to cool the base plate 16 and thus cool the base 12 via the adhesive layer 15.

A gas channel 18 is formed in the base 12, the adhesive layer 15, and the base plate 16 to pass therethrough. Also, a gas channel 21 is formed in the mounting portion 20 to pass therethrough. The gas channel 18 has a plurality of gas inlets 18a formed in the lower surface 16b of the base plate 16, and a plurality of gas outlets 18b formed in the upper surface 12a of the base 12. The gas channel 21 has a plurality of gas inlets 21a formed in a lower surface 20d of the mounting portion 20, and a plurality of gas outlets 21b formed in the upper surface 20a of the mounting portion 20. A plurality of gas outlets 18b are formed at the positions corresponding to a plurality of gas inlets 21a.

A plurality of gas inlets 18a are connected to a gas pressure controlling unit (not shown) provided out of the substrate temperature control fixing apparatus 10. The gas pressure controlling unit (not shown) can vary a pressure of an inert gas in a range of about 0 to 50 Torr, for example, and can introduce an inert gas into the gas channel 18 from the gas inlets 18a.

Figure 6:
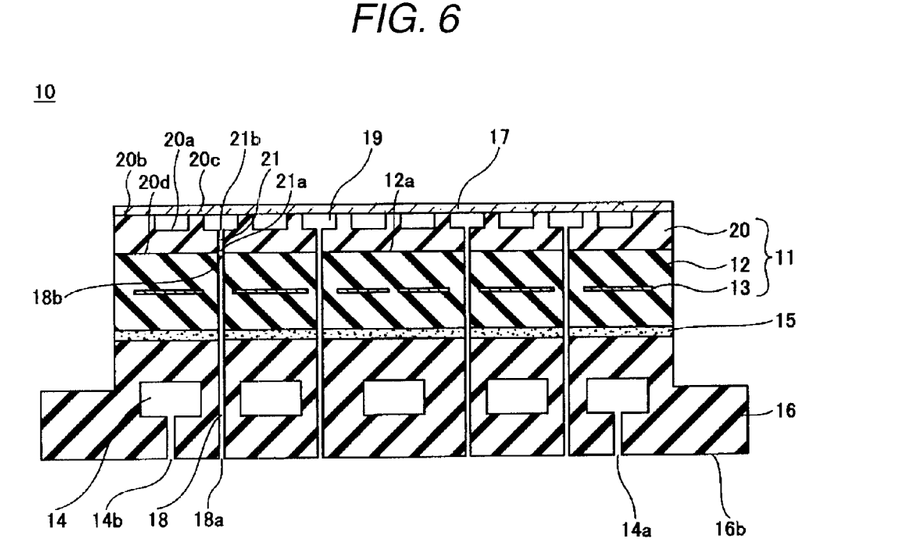
FIG. 6 is a schematic plan view showing a state that the substrate temperature control fixing apparatus according to the first exemplary embodiment attracts and holds a substrate.

FIG. 6 is a schematic plan view showing a state that the substrate temperature control fixing apparatus according to the first exemplary embodiment attracts and holds a substrate. In FIG. 6, the same reference symbols are affixed to the same components as those in FIG. 4 and FIG. 5, and their explanation will be omitted herein. In FIG. 6, 17 denotes a substrate, and 19 denotes a gas filling portion in which an inert gas is filled.

By reference to FIG. 6, the substrate 17 is attracted and held on upper surfaces of the projection portions 20c and the outer edge portion 20b of the mounting portion 20. That is, a predetermined voltage is applied to the electrostatic electrodes 13 from a DC power supply (not shown) provided outside of the substrate temperature control fixing apparatus 10. Accordingly, the Coulomb force is generated between the base 12 in which the electrostatic electrodes 13 are built and the mounting portion 20, and thus the mounting portion 20 is attracted and held on the upper surface 12a of the base 12.

As described above, a thickness of the mounting portion 20 is very thin (e.g., 0.2 mm to 9.0 mm). Therefore, the Coulomb force generated when a predetermined voltage is applied to the electrostatic electrodes 13 also acts on the substrate 17, which is mounted on the upper surfaces of the projection portions 20c and the outer edge portion 20b of the mounting portion 20, via the mounting portion 20. Thus, the substrate 17 is attracted and held on upper surfaces of the projection portions 20c and the outer edge portion 20b of the mounting portion 20. In other words, the Coulomb force is generated when a predetermined voltage is applied to the electrostatic electrodes 13, and then the mounting portion 20 and the substrate 17 are attracted and held on the upper surface 12a of the base 12 by this Coulomb force.

As described above, the mounting portion 20 is detachably mounted on the upper surface 12a of the base 12. Therefore, when a predetermined voltage is not applied to the electrostatic electrodes 13 and the Coulomb force is not generated, the mounting portion 20 can be removed easily from the upper surface 12a of the base 12.

A temperature of the substrate 17 is controlled by the heating element (not shown) and the water channel 14 provided to the base plate 16. The substrate 17 is formed of a silicon wafer, or the like, for example. A thickness of the substrate 17 is set to about 700 μm to 1000 μm, for example. The present embodiments can be applied to the substrate having a different thickness, depending upon shapes and dimensions of the base 12, the mounting portion 20, and the like.

The gas pressure controlling unit (not shown) introduces an inert gas into the gas channel 18 through the plurality of gas inlets 18a. The introduced inert gas is introduced into the gas inlet 21a from the gas outlets 18b, and is filled in the gas filling portions 19 as the spaces that are formed between the lower surface of the substrate 17 and the upper surface 20a of the mounting portion 20. Thus, a thermal conductivity between the base 12 and the mounting portion 20, and the substrate 17 can be improved. As the inert gas, He, Ar, for example, can be used.

In turn, a relationship between a voltage applied to the electrostatic electrodes 13 and a chucking force acting on the mounting portion 20 and the substrate 17 was examined. The results will be given in Experiments 1 to 4 explained hereunder.

EXPERIMENT 1

At first, a chucking force acting between the base 12 and the mounting portion 20 was examined in a situation that only the mounting portion 20 is put on the upper surface 12a of the base 12 and a voltage is applied to the electrostatic electrodes 13.

More specifically, three types of mounting portions 20L1, 20M1, and 20H1 were prepared as the mounting portion 20. Here, the mounting portion 20L1 contained an aluminum oxide ($Al_2O_3$) and had a thickness of 1 mm and a volume resistivity of $10^{11}$ Ωcm, the mounting portion 20M1 contained an aluminum oxide ($Al_2O_3$) and had a thickness of 1 mm and a volume resistivity of $101^3$ Ωcm. The mounting portion 20H1 contained an aluminum oxide ($Al_2O_3$) and had a thickness of 1 mm and a volume resistivity of $10^{15}$ Ωcm. A chucking force generated between the base 12 and the mounting portion 20 was examined depending on the voltage applied to the electrostatic electrodes 13. Here, a volume resistivity can be adjusted by adding a titanium dioxide ($TiO_2$) into the aluminum oxide ($Al_2O_3$).

Figure 7:
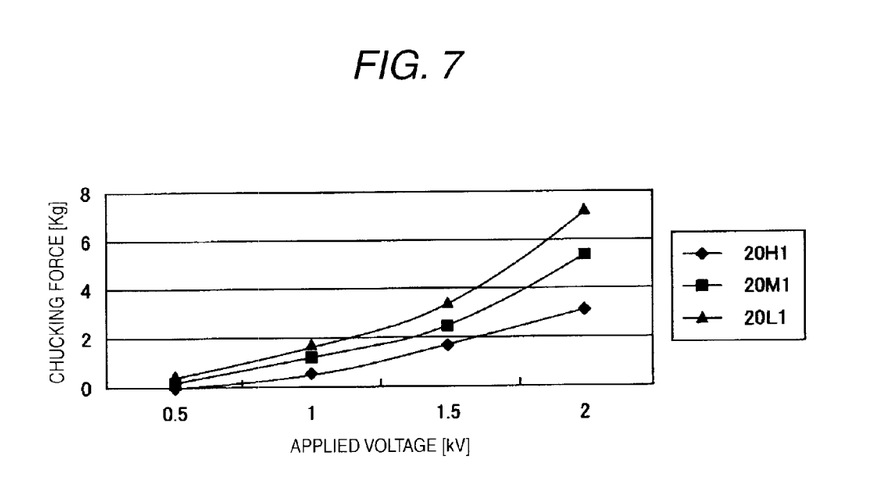
FIG. 7 is a graph showing a relationship between a voltage applied to electrostatic electrodes and a chucking force generated between a base and a mounting portion.

FIG. 7 is a graph showing a relationship between a voltage applied to the electrostatic electrodes 13 and a chucking force generated between the base 12 and the mounting portion 20. In FIG. 7, an "applied voltage [KV]" on the abscissa axis represents a DC voltage that was applied to the electrostatic electrodes 13 from a DC power supply provided outside of the substrate temperature control fixing apparatus 10. A "chucking force [Kg]" on the ordinate represents a chucking force that was generated between the base 12 and the mounting portion 20 and was measured by a tension gauge that was pushed against a side surface of the mounting portion 20.

It is advantageous that a chucking force between the base 12 and the mounting portion 20 should be set to 5 Kg or more. However, as shown in FIG. 7, when any of the mounting portions 20LI, 20M1, and 20H1 was used as the mounting portion 20, a chucking force generated between the base 12 and the mounting portion 20 was increased in accordance with the applied voltage. The applied voltage could be increased higher than 2 KV.

Namely, it was checked that a sufficient chucking force can be obtained between the base 12 and the mounting portion 20 by applying an adequate voltage to the electrostatic electrodes 13. Here, the base 12 used in Experiment 1 contained an aluminum oxide ($Al_2O_3$) and had a thickness of 1 mm and a volume resistivity of $10^{11}$ Ωcm.

EXPERIMENT 2

Next, the mounting portion 20 was mounted on the upper surface 12a of the base 12, and then the substrate 17 was mounted on the upper surfaces of the projection portions 20c and the outer edge portion 20b of the mounting portion 20. Then, when a voltage was applied to the electrostatic electrodes 13, a chucking force generated between the mounting portion 20 and the substrate 17 was examined. Similarly to Experiment 1, three mounting portions 20L1, 20M1, and 20H1 were prepared as the mounting portion 20.

Figure 8:
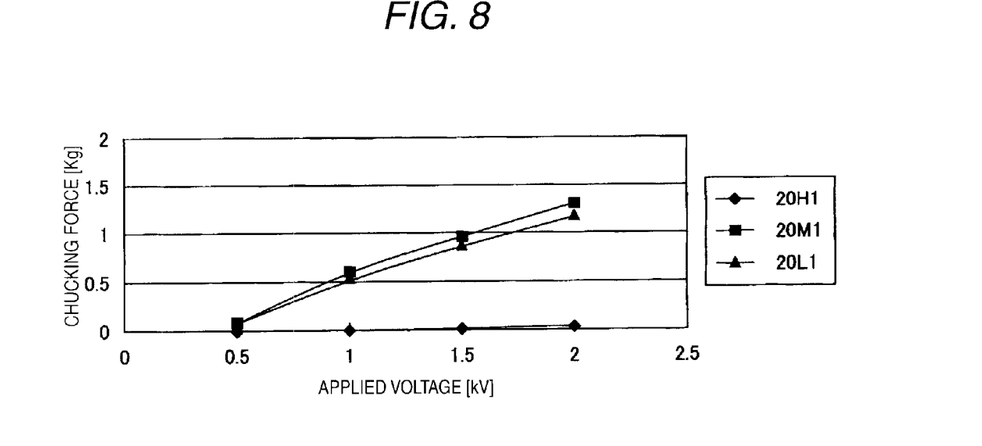
FIG. 8 is a graph showing another relationship between a voltage applied to electrostatic electrodes and a chucking force generated between a base and a mounting portion.

FIG. 8 is a graph showing another relationship between a voltage applied to the electrostatic electrodes 13 and a chucking force generated between the base 12 and the mounting portion 20. In FIG. 8, an "applied voltage [KV]" on the abscissa represents a DC voltage that was applied to the electrostatic electrodes 13 from a DC power supply provided outside of the substrate temperature control fixing apparatus 10. A "chucking force [Kg]" on the ordinate represents a chucking force that was generated between the mounting portion 20 and the substrate 17 and was measured by a tension gauge that was pushed against a side surface of the substrate 17.

It is advantageous that a chucking force between the mounting portion 20 and the substrate 17 should be set to 1 Kg or more. However, as shown in FIG. 8, when the mounting portion 20H1 was used as the mounting portion 20, the chucking force generated between the mounting portion 20 and the substrate 17 was hardly increased even though the applied voltage is increased. That is, when the mounting portion 20 has a thickness of 1 mm and a volume resistivity of $10^{15}$ Ωcm, the substrate 17 cannot be attracted and held on the upper surfaces of the projection portions 20c and the outer edge portion 20b of the mounting portion 20.

In contrast, as shown in FIG. 8, when the mounting portions 20L1 and 20M1 were used as the mounting portion 20, a chucking force generated between the mounting portion 20 and the substrate 17 was increased in accordance with the applied voltage. The applied voltage can be increased higher than 2 KV. Namely, it was checked that, when the mounting portion 20 has a thickness of 1 mm and a volume resistivity of $10^{11}$ Ωcm to $10^{13}$ Ωcm, a sufficient chucking force can be obtained between the mounting portion 20 and the substrate 17 by applying an adequate voltage to the electrostatic electrodes 13. Here, the base 12 used in Experiment 2 contained an aluminum oxide ($Al_2O_3$) and had a thickness of 1 mm and a volume resistivity of $10^{11}$ Ωcm.

EXPERIMENT 3

Next, the mounting portion 20 was mounted on the upper surface 12a of the base 12, and then the substrate 17 was mounted on the upper surfaces of the projection portions 20c and the outer edge portion 20b of the mounting portion 20. Then, when a voltage was applied to the electrostatic electrodes 13, a chucking force generated between the mounting portion 20 and the substrate 17 was examined. As the mounting portion 20, three types of mounting portions 20L2, 20M2, and 20H2 were prepared. Here, the mounting portion 20L2 contained an aluminum oxide ($Al_2O_3$) and had a thickness of 0.5 mm and a volume resistivity of $10^{11}$ Ωcm. The mounting portion 20M2 contained an aluminum oxide ($Al_2O_3$) and had a thickness of 0.5 mm and a volume resistivity of $10^{13}$ Ωcm, and the mounting portion 20H2 contained an aluminum oxide ($Al_2O_3$) and had a thickness of 0.5 mm and a volume resistivity of $10^{15}$ Ωcm.

Figure 9:
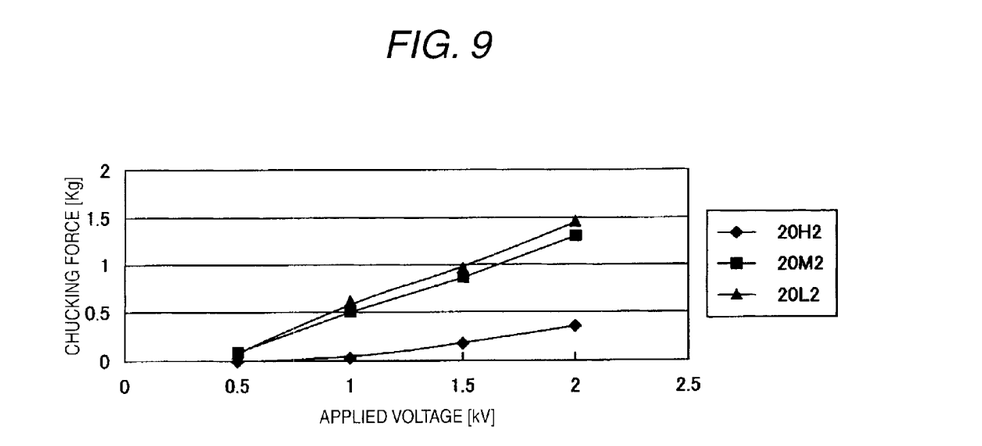
FIG. 9 is a view showing still another relationship between a voltage applied to electrostatic electrodes and a chucking force generated between a base and a mounting portion.

FIG. 9 is a graph showing still another relationship between a voltage applied to the electrostatic electrodes and a chucking force generated between the base 12 and the mounting portion 20. In FIG. 9, an "applied voltage [KV]" on the abscissa represents a DC voltage that was applied to the electrostatic electrodes 13 from a DC power supply provided outside of the substrate temperature control fixing apparatus 10. A "chucking force [Kg]" on the ordinate represents a chucking force that was generated between the mounting portion 20 and the substrate 17 and was measured by a tension gauge that was pushed against a side surface of the substrate 17.

As shown in FIG. 9, when any of the mounting portions 20L2, 20M2, and 20H2 was used as the mounting portion 20, a chucking force generated between the mounting portion 20 and the substrate 17 was increased in accordance with the applied voltage. The applied voltage could be increased higher than 2 KV. Namely, it was checked that, when the mounting portion 20 has a thickness of 0.5 mm and a volume resistivity of $10^{11}$ Ωcm to $10^{15}$ Ωcm, a sufficient chucking force can be obtained between the mounting portion 20 and the substrate 17 by applying an adequate voltage to the electrostatic electrodes 13.

In this case, as can be seen from FIG. 9, a necessary chucking force (1 Kg or more) could not be obtained in the case of the mounting portion 20H2 unless the applied voltage should be set considerably highly, and it is impossible to say that the mounting portion 20H2 was suitable for practical use. In other words, it is advantageous that, even though the mounting portion 20 has a thickness of 0.5 mm, the mounting portion 20 should have a volume resistivity of $10^{11}$ Ωcm to $10^{13}$ Ωcm in view of the relationship between the applied voltage and the chucking force (gradients of respective straight lines of 20L2, 20M2, 20H2 in FIG. 9). Here, the base 12 used in Experiment 3 contained an aluminum oxide ($Al_2O_3$) and had a thickness of 1 mm and a volume resistivity of $10^{11}$ Ωcm.

EXPERIMENT 4

Next, the mounting portion 20 was mounted on the upper surface 12a of the base 12, and then the substrate 17 was mounted on the upper surfaces of the projection portions 20c and the outer edge portion 20b of the mounting portion 20. Then, when a voltage was applied to the electrostatic electrodes 13, a chucking force generated between the mounting portion 20 and the substrate 17 was examined. As the mounting portion 20, the above mounting portions 20L1, 20M1, and 20H1 and the above mounting portions 20L2, 20M2, and 20H2 were prepared.

Also, three types of base bodies 12L, 12M, 12H were prepared. Here, the base 12L contained an aluminum oxide ($Al_2O_3$) and had a thickness of 1 mm and a volume resistivity of $10^{11}$ Ωcm. The base 12M contained an aluminum oxide ($Al_2O_3$) and had a thickness of 1 mm and a volume resistivity of $10^{13}$ Ωcm, and the base 12H contained an aluminum oxide ($Al_2O_3$) and had a thickness of 1 mm and a volume resistivity of $10^{15}$ Ωcm.

When a voltage was applied to the electrostatic electrodes 13 while combining in sequence the bases 12 (12L, 12M, 12H) with the mounting portions 20 (20L1, 20M1, and 20H1, and 20L2, 20M2 and 20H2) respectively, a chucking force generated between the mounting portion 20 and the substrate 17 was measured by a tension gauge. The results are given in Table 1.

TABLE 1

| | | Mounting portion 20 (lower stage: thickness) | | | | | |
|---|---|---|---|---|---|---|---|
| | | 20H2 0.5 mm | 20H1 1.0 mm | 20M2 0.5 mm | 20M1 1.0 mm | 20L2 0.5 mm | 20L1 1.0 mm |
| Base 12M | 12H | x | x | x | x | x | x |
| | 12M | x | x | Δ | Δ | ○ | ○ |
| | 12L | x | x | Δ | Δ | ○ | ○ |

In Table 1, "○" indicates that the combination is available for practical use, "Δ" indicates that the combination is available for practical use if the applied voltage is increased, and "x" indicates that the combination is unavailable for practical use. From Table 1, it was checked that, when the type of the base 12 corresponds to 12L or 12M and the type of the mounting portion 20 corresponds to 20M1, 20M2, 20L1 or 20L2, the substrate 17 can be attracted and held on the upper surfaces of the projection portions 20c and the outer edge portion 20b of the mounting portion 20 by applying an adequate voltage to the electrostatic electrodes 13.

Namely, when a volume resistivity of the base 12 is $10^{11}$ Ωcm to $10^{13}$ Ωcm and also a thickness of the mounting portion 20 is 1.0 mm or less and a volume resistivity is $10^{11}$ Ωcm to $10^{13}$ Ωcm, the substrate 17 can be attracted and held on the upper surfaces of the projection portions 20c and the outer edge portion 20b of the mounting portion 20 by applying an adequate voltage to the electrostatic electrodes 13.

The more advantageous conditions may be given as follows. First, a thickness of the mounting portion 20 should be set preferably to about 0.2 mm to 1.0 mm, and more preferably 0.5 mm or less. This is because, when an adequate voltage is applied to the electrostatic electrodes 13, a chucking force generated between the mounting portion 20 and the substrate 17 becomes larger as a thickness of the mounting portion 20 is reduced thinner.

Second, a pattern width of the electrostatic electrodes 13 should be set preferably broadly (about 1 cm to 2 cm). This is because a loss of lines of electric force emitted from the electrostatic electrodes 13 hardly occurs and a strong chucking force can be obtained. Here, a "pattern width" of the electrostatic electrodes 13 indicates a length of the electrostatic electrodes 13 in the substantially parallel direction to the upper surface 12a of the base 12 in FIG. 5.

Third, a roughness Ra of the upper surface 12a of the base 12 and the lower surface 20d of the mounting portion 20 should be set preferably to about 0.1 μm to 1.0 μm, and more preferably Ra 0.4 μm or less. This is because adhesion between the upper surface 12a of the base 12 and the lower surface 20d of the mounting portion 20 is improved.

In the substrate temperature control fixing apparatus 10 according to the first exemplary embodiment, the mounting portion 20 is detachably mounted on the upper surface 12a of the base 12 in which the electrostatic electrodes 13 are built.

Then, the substrate 17 is mounted on the upper surfaces of the projection portions 20c and the outer edge portion 20b of the mounting portion 20. When an appropriate voltage is applied to the electrostatic electrodes 13 in this state, the substrate 17 can be attracted and held on the upper surfaces of the projection portions 20c and the outer edge portion 20b of the mounting portion 20.

Therefore, even though conditions of the upper surfaces of the projection portions 20c and the outer edge portion 20b of the mounting portion 20 are changed by the adhered substances, the mounting portion 20 can be easily replaced with another one. Accordingly, the electrostatic chuck that is excellent in maintainability and the substrate temperature control fixing apparatus having the electrostatic chuck can be provided, and thus occurrence of a maintenance cost and reduction of an availability factor can be prevented.

Also, yield of the substrate 17 mounted on the upper surfaces of the projection portions 20c and the outer edge portion 20b of the mounting portion 20 can be improved by replacing the mounting portion 20 routinely.

In particular, when a volume resistivity of the base 12 is $10^{11}$ Ωcm to $10^{13}$ Ωcm and also a thickness of the mounting portion 20 is 1.0 mm or less and a volume resistivity is $10^{11}$ Ωcm to $10^{13}$ Ωcm, the good chucking performance can be ensured.

Variation 1 of First Exemplary Embodiment

Figure 10:
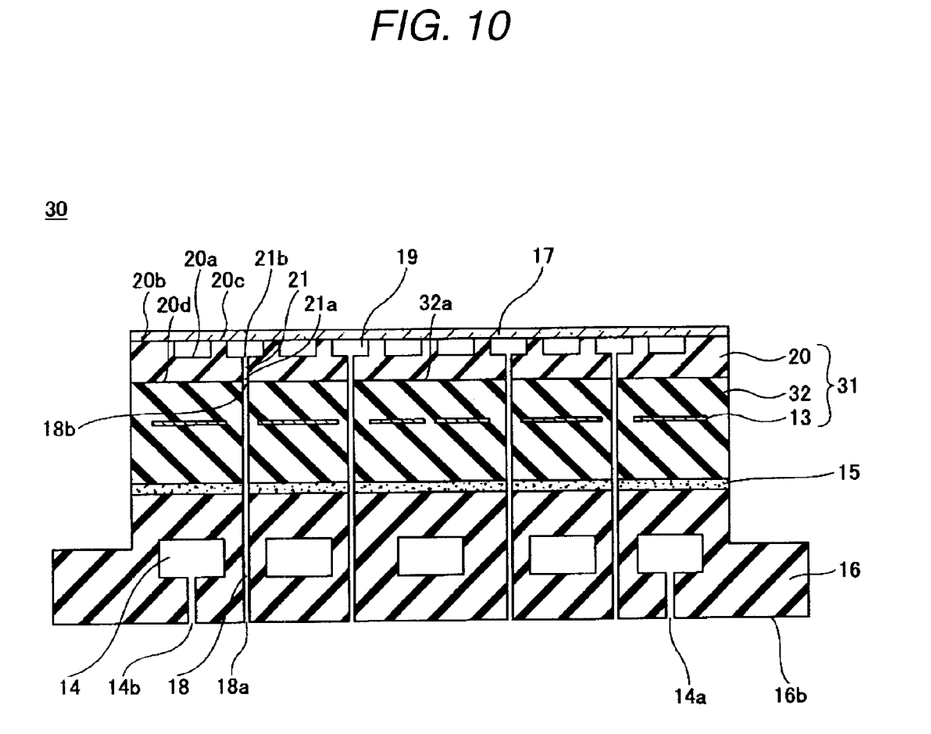
FIG. 10 is a schematic sectional view showing a substrate temperature control fixing apparatus according to Variation 1 of the first exemplary embodiment of the present invention.

FIG. 10 is a schematic sectional view showing a substrate temperature control fixing apparatus according to a variation 1 of the first exemplary embodiment. In FIG. 10, the same reference symbols are affixed to the same components as those in FIG. 6, and their explanation will be omitted in some cases. By reference to FIG. 10, a substrate temperature control fixing apparatus 30 is configured similarly to the substrate temperature control fixing apparatus 10 shown in FIG. 6, except that the electrostatic chuck 11 in FIG. 6 is replaced with an electrostatic chuck 31. In FIG. 10, 32a denotes an upper surface of a base 32. Only different portions from those of the substrate temperature control fixing apparatus 10 will be explained hereunder.

In FIG. 10, the base 32 constituting the electrostatic chuck 31 is made thicker than the base 12 constituting the electrostatic chuck 11. Also, a distance from the substrate 17 to the electrostatic electrodes 13 is not changed. This is because, when a distance from the substrate 17 to the electrostatic electrodes 13 is extended, a chucking force acting on the substrate 17 is weakened. In other words, the portion, which is located lower than the electrostatic electrodes 13 (i.e., portion which is located closer to the adhesive layer 15), of the base 32 is made thicker than that of the base 12.

When the base 32 is thickened in this manner, a distance between the substrate 17 and the adhesive layer 15 becomes longer. Accordingly, a probability that the plasma strikes the adhesive layer 15 can be decreased. In this case, such effect is increased when the base 32 is formed thicker.

In the substrate temperature control fixing apparatus 30 according to Variation 1, the similar advantages to those of the substrate temperature control fixing apparatus 10 according to the first exemplary embodiment can be achieved. Also, since the base 32 is formed thicker, a probability that the plasma strikes the adhesive layer 15 can be decreased, and also it can be prevented that the adhesive layer 15 is corroded by the plasma.

Variation 2 of First Exemplary Embodiment

Figure 11:
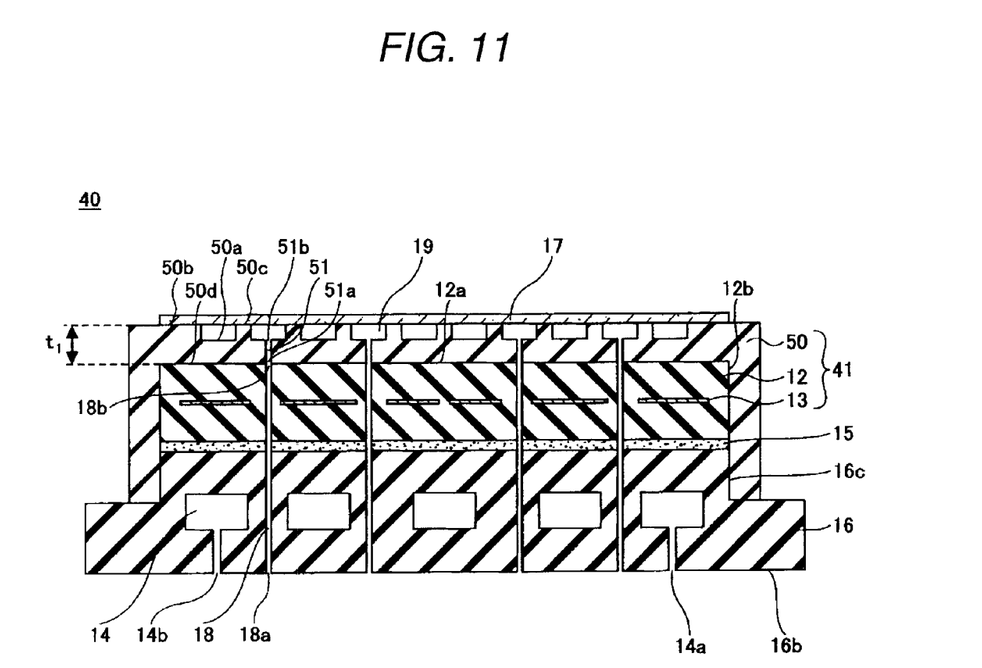
FIG. 11 is a schematic sectional view showing a substrate temperature control fixing apparatus according to Variation 2 of the first exemplary embodiment.

FIG. 11 is a schematic sectional view showing a substrate temperature control fixing apparatus according to Variation 2 of the first exemplary embodiment. In FIG. 11, the same reference symbols are affixed to the same components as those in FIG. 6, and their explanation will be omitted in some cases. By reference to FIG. 11, a substrate temperature control fixing apparatus 40 is configured similarly to the substrate temperature control fixing apparatus 10 shown in FIG. 6, except that the electrostatic chuck 11 in FIG. 6 is replaced with an electrostatic chuck 41. In FIG. 11, 12b denotes a side surface of the base 12, and 16c denotes a portion of a side surface (a portion located upper than a level difference) of the base plate 16. Only different portions from those of the substrate temperature control fixing apparatus 10 will be explained hereunder.

In FIG. 11, the electrostatic chuck 41 is the Coulomb force type electrostatic chuck that is equipped with the base 12, the electrostatic electrodes 13, and a mounting portion 50. As compared with the mounting portion 20, the mounting portion 50 is configured to cover the upper surface 12a and the side surface 12b of the base 12, side surfaces of the adhesive layer 15 (portions exposed from the base 12 and the base plate 16), and the portion 16c of the side surface of the base plate 16. Similarly to the mounting portion 20, the mounting portion 50 is detachably mounted.

The mounting portion 50 is formed of a dielectric material. A relative dielectric constant (1 KHz) of the mounting portion 50 can be set to about 9 to 10, for example, and a volume resistivity can be set to about 10 to $10^{13}$ Ωcm, for example. Also, a thickness $t_1$ of the portion of the mounting portion 50 corresponding to the upper surface 12a of the base 12 can be set to about 0.2 mm to 1.0 mm, for example. As the base 50, ceramics containing aluminum oxide ($Al_2O_3$), aluminum nitride (AlN), for example can be employed. Also, titanium dioxide ($TiO_2$) may be added to aluminum oxide ($Al_2O_3$). Also, a dielectric film formed of polyester, polyimide, for example, may be used as the mounting portion 50.

Since respective portions 50a, 50b, 50c, 50d, 51, 51a, 51b of the mounting portion 50 correspond to the portions 20a, 20b, 20c, 20d, 21, 21a, 21b of the mounting portion 20 and have the similar function respectively, their explanation will be omitted herein. Since side surfaces of the adhesive layer 15 are covered with the mounting portion 50 in this manner, it can be prevented that the plasma hits the adhesive layer 15.

In the substrate temperature control fixing apparatus 40 according to Variation 2, the similar advantages to those of the substrate temperature control fixing apparatus 10 according to the first exemplary embodiment can be achieved. Also, since the side surfaces of the adhesive layer 15 are covered with the mounting portion 50 in this manner, the plasma does not hit the adhesive layer 15. As a result, it can be prevented that the adhesive layer 15 is corroded by the plasma.

Variation 3 of First Exemplary Embodiment

Figure 12:
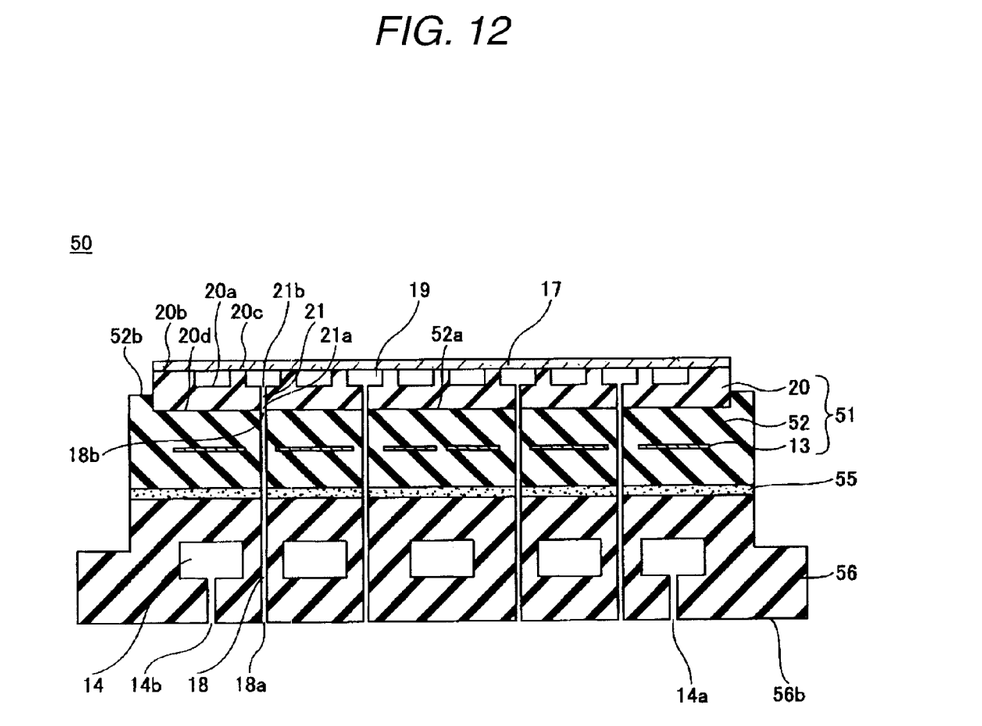
FIG. 12 is a schematic sectional view showing a substrate temperature control fixing apparatus according to Variation 3 of the first exemplary embodiment.

FIG. 12 is a schematic sectional view showing a substrate temperature control fixing apparatus according to a variation 3 of the first exemplary embodiment. In FIG. 12, the same reference symbols are affixed to the same components as those in FIG. 6, and their explanation will be omitted in some cases. By reference to FIG. 12, a substrate temperature control fixing apparatus 50 is configured similarly to the substrate temperature control fixing apparatus 10 shown in FIG. 6, except that the electrostatic chuck 11 shown in FIG. 6 is replaced with the electrostatic chuck 51, the base 12 is replaced with a base 52, the adhesive layer 15 is replaced with an adhesive layer 55, and the base plate 16 is replaced with a base plate 56.

In FIG. 12, 52a denotes an upper surface of the base 52, 52b denotes a positioning portion of the base 52, and 56b denotes a lower surface of the base plate 56. Only different portions from, those of the substrate temperature control fixing apparatus 10 will be explained hereunder.

In FIG. 12, the adhesive layer 55 and the base plate 56 are similar to the adhesive layer 15 and the base plate 16 respectively, except that respective diameters are larger than those of the adhesive layer 15 and the base plate 16. The electrostatic chuck 51 is the Coulomb force type electrostatic chuck that is equipped with the base 52, the electrostatic electrodes 13, and the mounting portion 20. The base 52 has a larger diameter than the base 12. The annular positioning portion 52b, when viewed from the top, is provided on the outer peripheral portion. The mounting portion 20 is detachably mounted on the upper surface 52a of the base 52 whose outer edge portion is surrounded by the positioning portion 52b.

In this manner, the positioning portion 52b is provided to the outer edge portion of the base 52, and the mounting portion 20 is mounted on the upper surface 52a of the base 52 whose outer edge portion is surrounded by the positioning portion 52b. Therefore, an alignment precision of the mounting portion 20 with the base 52 can be improved.

In this case, the positioning portion 52b is provided to improve an alignment precision of the mounting portion 20 with the base 52. Any profile may be employed if the positioning portion 52b can achieve the purpose. The positioning portion 52b should not always be provided to the outer edge portion like the annular shape when viewed from the top. For example, as the positioning portion 52b, a plurality of circular column projections may be provided on the outer edge portion at an appropriate interval. Also, for example, in place of them or together with them, concave portions and/or convex portions may be provided on the upper surface 52a of the base 52 and also convex portions and/or concave portions may be provided on portions of the lower surface 20d of the mounting portion 20 corresponding to the above portions so as to fit the above portions.

In the substrate temperature control fixing apparatus 50 according to Variation 3, the similar advantages to those of the substrate temperature control fixing apparatus 10 according to the first exemplary embodiment can be achieved. Also, the positioning portion 52b is provided to the outer edge portion of the base 52, and the mounting portion 20 is mounted on the upper surface 52a of the base 52 whose outer edge portion is surrounded by the positioning portion 52b. Therefore, an alignment precision of the mounting portion 20 with the base 52 can be improved.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

For example, the substrate temperature control fixing apparatus 30 in Variable I and shown in FIG. 10 may be changed to have the configuration in which an alignment precision of the mounting portion with the base can be improved as shown in Variable 3. Also, the base 12 may be formed thicker as the substrate temperature control fixing apparatus 40 in Variable 2 and shown in FIG. 11.

Also, when such a problem is not caused that the particles are adhered onto the substrate, no projection portion may be provided on the upper surface of the mounting portion and the upper surface may be formed to be flat.

What is claimed is:

1. An electrostatic chuck for holding an object, comprising:
   a base;
   an electrostatic electrode built in the base; and
   a mounting portion containing a dielectric material and detachably mounted on the base, wherein the object is mounted on the mounting portion, and
   wherein a lower surface of the mounting portion is provided on an upper surface of the base.

2. The electrostatic chuck according to claim 1, wherein, when a voltage is applied to the electrostatic electrode, the mounting portion and the object are attracted to the base by a Coulomb force.

3. The electrostatic chuck according to claim 1, wherein a positioning portion is provided on the base, and the mounting portion is positioned by the positioning portion.

4. The electrostatic chuck according to claim 3, wherein the positioning portion is provided on an outer edge portion of the mounting portion, and has an annular shape when viewed from the top.

5. The electrostatic chuck according to claim 1, wherein a plurality of projection portions are provided on the mounting portion such that the projection portions are dotted like a polka dots pattern, when viewed from the top.

6. An apparatus comprising:
   the electrostatic chuck according to claim 1; and
   a base plate which supports the electrostatic chuck and controls a temperature of the electrostatic chuck,
   wherein the electrostatic chuck is fixed onto the base plate via an adhesive layer.

7. The apparatus according to claim 6,
   wherein the mounting portion is provided to cover an upper surface and side surfaces of the base and side surfaces of the adhesive layer.

8. The apparatus according to claim 6,
   wherein the base plate comprises:
   a gas channel which introduces an inert gas into the electrostatic chuck;
   a heating element which heats the electrostatic chuck; and
   a water channel which cools the electrostatic chuck.

9. The apparatus according to claim 8, wherein the gas channel is defined through the mounting portion, the base, the adhesive layer, and the base plate as a continuous and substantially linear channel.

10. The electrostatic chuck according to claim 1, wherein the mounting portion is detachably mounted directly on the base.

11. The electrostatic chuck according to claim 10, wherein the mounting portion and base are configured such that when a voltage is applied to the electrostatic electrode, the mounting portion and the object are attracted to the base by a Coulomb force.

12. The electrostatic chuck according to claim 1, wherein outer edges of the mounting portion are flush with outer edges of the base.

13. The electrostatic chuck according to claim 1, wherein the mounting portion is held onto the upper surface of the base only when a voltage is applied to the electrostatic electrode.

14. The electrostatic chuck according to claim 1, wherein the mounting portion is held onto the base only when a voltage is applied to the electrostatic electrode.

15. The electrostatic chuck according to claim 1, wherein the mounting portion and base are configured such that when a voltage is applied to the electrostatic electrode, the mounting portion and the object are attracted to the base by a Coulomb force.

* * * * *